United States Patent
Bode et al.

(10) Patent No.: US 7,420,457 B2
(45) Date of Patent: Sep. 2, 2008

(54) SYSTEM AND METHOD FOR VALIDATING RADIO FREQUENCY IDENTIFICATION TAGS

(75) Inventors: Udo Heinz Helmut Bode, East Haven, CT (US); Edward Michael Bosco, Claysville, PA (US); William G. Gunther, Guilford, CT (US); Roman Golicz, Clinton, CT (US); Stefan G. Golicz, Saybrook, CT (US)

(73) Assignee: George Schmitt & Company, Inc., Guilford, CT (US)

( * ) Notice: Subject to any disclaimer, the term of this patent is extended or adjusted under 35 U.S.C. 154(b) by 546 days.

(21) Appl. No.: 11/229,214

(22) Filed: Sep. 16, 2005

(65) Prior Publication Data

US 2006/0006885 A1     Jan. 12, 2006

Related U.S. Application Data

(63) Continuation-in-part of application No. 10/947,752, filed on Sep. 23, 2004.

(60) Provisional application No. 60/536,097, filed on Jan. 13, 2004, provisional application No. 60/591,397, filed on Jul. 27, 2004.

(51) Int. Cl.
*H04Q 5/22* (2006.01)

(52) U.S. Cl. ................ 340/10.1; 340/572.1; 340/572.8; 340/10.5

(58) Field of Classification Search ............. 340/572.1, 340/572.8, 10.1, 10.5, 572.2–7, 10.2, 10.3, 340/10.31–34, 10.4–42, 10.51, 10.52
See application file for complete search history.

(56) References Cited

U.S. PATENT DOCUMENTS

| | | | |
|---|---|---|---|
| 6,236,223 B1 | 5/2001 | Brady et al. | 327/765 |
| 6,639,509 B1 | 10/2003 | Martinez | 340/10.4 |
| 2005/0110641 A1 | 5/2005 | Mendolia et al. | 340/572.7 |
| 2005/0140457 A1 | 6/2005 | Bellantoni | 332/106 |
| 2005/0150102 A1 | 7/2005 | Bosco et al. | 29/593 |
| 2005/0156039 A1 | 7/2005 | Carrender et al. | 235/439 |
| 2005/0159913 A1 | 7/2005 | Ariyoshi et al. | 702/122 |
| 2007/0040689 A1* | 2/2007 | Reynolds | 340/572.7 |

OTHER PUBLICATIONS

International Search Report, Mar. 22, 2007, 6 pages.
N. Marcuvitz, Waveguide Handbook, McGRaw-Hill, New York, (1951), Chapter 5 pp. 218-223.

* cited by examiner

*Primary Examiner*—George A Bugg
*Assistant Examiner*—Travis R Hunnings
(74) *Attorney, Agent, or Firm*—St. Onge Steward Johnston & Reens LLC (57) ABSTRACT

A radio frequency identification tag reading/writing station is adapted to be used with a radio frequency identification tag reader/writer in order to read/write radio frequency identification tags on a continuous web of carrier material. The radio frequency identification tag reading/writing station includes a first waveguide to coax adaptor, a second waveguide to coax adapter, and a window assembly having a window therein, the window being sized and shaped such that a tag on the web of carrier material under test is exposed to radio frequency read/write energy, but such that tags on the web of carrier material adjacent to the tag under test are shielded from the radio frequency read/write energy. The first waveguide to coax adapter and the second waveguide to coax adapter are disposed end-to-end with the window assembly being disposed therebetween.

22 Claims, 7 Drawing Sheets

SYSTEM AND METHOD FOR VALIDATING RADIO FREQUENCY IDENTIFICATION TAGS

RELATED APPLICATIONS

This patent application is a continuation-in-part of currently pending U.S. patent application Ser. No. 10/947,752, filed on Sep. 23, 2004, which application claims the benefit of, under Title 35, United States Code, Section 119(e), U.S. Provisional Patent Application No. 60/536,097, filed Jan. 13, 2004 and U.S. Provisional Patent Application No. 60/591,397, filed Jul. 27, 2004.

FIELD OF THE INVENTION

The present invention relates generally to radio frequency identification tags, used for example in connection with warehousing, inventory management and product tracking, and more particularly to systems and methods for validating such radio frequency identification tags to ensure proper functioning thereof.

BACKGROUND OF THE INVENTION

Radio frequency identification (RFID) is a technology which is rapidly gaining acceptance in a variety of fields including warehousing, inventory management, and product tracking. It is based on a system which is comprised of a reader (e.g., a radio transmitter/receiver with antennae), a tag (comprised of a miniature antenna with a silicone chip attached thereto), and a processor which captures information received from individual tags. Each silicone chip is programmed with a unique electronic product code (EPC), and in many instances tags are covertly attached to or packaged with products, for example via a blank or printed label or by some other means.

Readers generally operate at three different frequencies: low, high, and ultra high (ultra high being generally recognized as being from 300 to 1000 MHz). The read range of a tag is a function of the frequency and size of the tag antenna, because tags are passive and are only energized when they are in the field of the radio waves transmitted by the reader. The ultra high frequency (e.g., 900 MHz) tags are becoming the tag of choice for most inventory control applications because of their relatively long read range (e.g., up to 14 feet in typical situations, and up to 30 meters in some applications).

Ordinary labels are relatively inexpensive to produce (e.g., less than a penny each), as compared to the cost of producing an RFID tag (e.g., $0.20 to $1.00 or more each), even before it is applied to a printed label. For this reason, RFID labeling has been generally restricted to the shipping carton or skid level. However, now there are powerful forces which are mandating RFID tagging at the item level for some products. Various governmental agencies, such as Congress, the Department of Defense and the FDA are pressuring parties, such as suppliers and pharmaceutical companies, to create better inventory control of certain goods, materials, and prescription drugs, and to implement more effective product authentication through overt and covert security features. In addition, Wal-Mart® has dictated to its major suppliers that they will support RFID within the very near future.

Currently, RFID tag manufacturers are not able to guarantee that all tag inlays that they ship are readable, functional tags—in fact, as many as 20% of the incoming tags may be non-readable. However, for many applications, label printers must be able to ensure that 100% (or at least very close to 100%) of the RFID labels are readable. This means that all RFID labels need to be read and verified when they are in their finished state, i.e. mounted in close proximity to one and another (e.g., inches apart) in a continuous web of paper which is then coiled into a roll of labels. Reader/verification equipment exists that at slow speed can read labels which are close together with a very short read range. Similarly, reader/verification equipment exists that can read RFID labels which have a longer read range (e.g., several feet), but the labels have to be far apart. The difficulty is in discriminating between labels that have a long read range, but that are spaced closely together. There is no known commercially available system which will effectively guarantee that substantially 100% of the ultra high frequency (e.g., 900 MHz) tags mounted in a roll at close proximity (e.g., a few inches apart) and that have a long read range (e.g., greater than 24") are all functional tags, while being processed at normal production speeds (e.g., several hundred labels per minute).

What is desired, therefore, is a system and method for validating radio frequency identification tags to ensure proper functioning thereof which is capable of ensuring that 100% (or at least very close to 100%) of the RFID labels are readable, which is capable of reading and verifying RFID labels when they are in their finished state, i.e. mounted in close proximity to one and another (e.g., inches apart) on a liner or carrier (for example a continuous web of paper of the like), which is adapted to be used in conjunction with tags having a long read range (e.g., greater than 24"), and which is capable of reading and validating labels moving at a relatively fast speed.

SUMMARY OF THE INVENTION

Accordingly, it is an object of the present invention to provide a system and method for validating radio frequency identification tags to ensure proper functioning thereof which is capable of ensuring that 100% (or at least very close to 100%) of the RFID labels are readable.

Another object of the present invention is to provide a system and method for validating radio frequency identification tags to ensure proper functioning thereof having the above characteristics and which is capable of reading and verifying RFID labels when they are in their finished state, i.e. mounted in close proximity to one and another (e.g., inches apart) on a liner or carrier (for example a continuous web of paper of the like).

A further object of the present invention is to provide a system and method for validating radio frequency identification tags to ensure proper functioning thereof having the above characteristics and which is adapted to be used in conjunction with tags having a long read range (e.g., greater than 24").

Still another object of the present invention is to provide a system and method for validating radio frequency identification tags to ensure proper functioning thereof having the above characteristics and which is capable of reading and validating labels moving at a relatively fast speed.

These and other objects are achieved according to one embodiment of the present invention by provision of a radio frequency identification tag reading/writing station adapted to be used with a radio frequency identification tag reader/writer in order to read/write radio frequency identification tags on a continuous web of carrier material. The radio frequency identification tag reading/writing station includes a first waveguide to coax adaptor, a second waveguide to coax adapter, and a window assembly having a window therein, the window being sized and shaped such that a tag on the web of carrier material under test is exposed to radio frequency read/write energy, but such that tags on the web of carrier material adjacent to the tag under test are shielded from the radio frequency read/write energy. The first waveguide to coax adapter and the second waveguide to coax adapter are disposed end-to-end with the window assembly being disposed therebetween.

In some embodiments, the radio frequency read/write energy is introduced through the first waveguide to coax adapter, and signals emitted by the tag under test are reflected back through the first waveguide to coax adapter, whereby the radio frequency identification tag reading/writing station employs a reflective technique. In certain of these embodiments, the radio frequency identification tag reading/writing station further includes a resistive termination in communication with the second waveguide to coax adapter for absorbing radio frequency read/write energy passing through the window assembly into the second waveguide to coax adapter.

In some embodiments, the radio frequency identification tag reading/writing station further includes a directional coupler, the directional coupler comprising a first port, a second port and a third port, with the radio frequency read/write energy passing through the directional coupler from the first port to the second port of the directional coupler, and with the signals emitted by the tag under test passing through the directional coupler from the second port to the third port of the directional coupler. In certain of these embodiments, the radio frequency identification tag reader/writer in connection with which the radio frequency identification tag reading/writing station is adapted for use has separate read and write ports, and the radio frequency identification tag reading/writing station further includes a power splitter or Tee, the power splitter or tee having three ports, one of which is in communication with the radio frequency identification tag reader/writer, one of which is in communication with the directional coupler, and one of which is in communication with a resistive termination. In certain embodiments, the radio frequency identification tag reader/writer in connection with which the radio frequency identification tag reading/writing station is adapted for use has a combined read and write port, and the radio frequency identification tag reading/writing station further includes a circulator, the circulator having three ports, one of which is in communication with the radio frequency identification tag reader/writer, one of which is in communication with the first port of the directional coupler, and one of which in communication with the third port of the directional coupler, with an isolator disposed therebetween.

In some embodiments, the radio frequency read/write energy is introduced through the first waveguide to coax adapter, and signals emitted by the tag under test are passed through the window assembly and the second waveguide to coax adapter, whereby the radio frequency identification tag reading/writing station employs a through technique. In certain of these embodiments, the radio frequency identification tag reader/writer in connection with which the radio frequency identification tag reading/writing station is adapted for use has separate read and write ports, and the radio frequency identification tag reading/writing station further includes a power splitter or Tee, the power splitter or tee having three ports, one of which is in communication with the radio frequency identification tag reader/writer, one of which is in communication with the first waveguide to coax adapter, with an isolator disposed therebetween, and one of which is attached to a resistive termination. In certain embodiments, the radio frequency identification tag reader/writer in connection with which the radio frequency identification tag reading/writing station is adapted for use has a combined read and write port, and the radio frequency identification tag reading/writing station further includes a circulator, the circulator having three ports, one of which is in communication with the radio frequency identification tag reader/writer, one of which is in communication with the first waveguide to coax adapter, and one of which in communication with the second waveguide to coax adapter, with an isolator disposed therebetween.

In some embodiments, the window assembly comprises two outer plates with an inner plate sandwiched therebetween, the inner plate defining a channel adapted to receive the web of carrier material, and the two outer plates defining a window aligned with the channel. In some embodiments, the radio frequency identification tag reading/writing station is used to read tags. In some embodiments, the radio frequency identification tag reading/writing station is used to write to tags.

In accordance with another embodiment of the present invention, a system for validating each of a plurality of radio frequency identification tags disposed on a continuous web of carrier material in close proximity to one another to ensure proper functioning thereof includes a narrow angle radio frequency identification tag reading station which reads a designation of each radio frequency identification tag individually in order to generate a first list of tag designations read thereby, the narrow angle radio frequency identification tag reading station adapted to be used with a radio frequency identification tag reader in order to read the radio frequency identification tags on the continuous web of carrier material, The narrow angle radio frequency identification tag reading station includes a first waveguide to coax adaptor, a second waveguide to coax adapter, and a window assembly having a window therein, the window being sized and shaped such that a tag on the web of carrier material under test is exposed to radio frequency read energy, but such that tags on the web of carrier material adjacent to the tag under test are shielded from the radio frequency read energy. The first waveguide to coax adapter and the second waveguide to coax adapter are disposed end-to-end with the window assembly being disposed therebetween. The system also includes a wide angle radio frequency identification tag reading station which reads designations of a plurality of radio frequency identification tags on the continuous web of carrier material simultaneously from a long range in order to generate a second list of tag designations read thereby, and a processor which compares the first list of tag designations with the second list of tag designations and evaluates the functionality of the plurality of radio frequency identification tags based at least in part upon the comparison.

In some embodiments, the radio frequency read energy is introduced through the first waveguide to coax adapter, and signals emitted by the tag under test are reflected back through the first waveguide to coax adapter, whereby the narrow angle radio frequency identification tag reading station employs a reflective technique. In certain of these embodiments, the system further includes a resistive termination in communication with the second waveguide to coax adapter for absorbing radio frequency read energy passing through the window assembly into the second waveguide to coax adapter.

In some embodiments, the narrow angle radio frequency identification tag reading station further includes a directional coupler, the directional coupler comprising a first port, a second port and a third port, with the radio frequency read energy passing through the directional coupler from the first port to the second port of the directional coupler; and with the signals emitted by the tag under test passing through the directional coupler from the second port to the third port of the directional coupler. In certain of these embodiments, the radio frequency identification tag reader in connection with which the narrow angle radio frequency identification tag reading station is adapted for use has separate read and write ports, and the narrow angle radio frequency identification tag reading station further includes a power splitter or Tee, the power splitter or tee having three ports, one of which is in communication with the radio frequency identification tag reader, one of which is in communication with the directional coupler, and one of which is in communication with a resistive termination. In certain embodiments, the radio frequency identification tag reader in connection with which the narrow angle radio frequency identification tag reading station is adapted for use has a combined read and write port, and the narrow angle radio frequency identification tag reading station further includes a circulator, the circulator having three ports, one of which is in communication with the radio frequency identification tag reader, one of which is in communication with the first port of the directional coupler, and one of which in communication with the third port of the directional coupler, with an isolator disposed therebetween.

In some embodiments, the radio frequency read energy is introduced through the first waveguide to coax adapter, and signals emitted by the tag under test are passed through the window assembly and the second waveguide to coax adapter, whereby the narrow angle radio frequency identification tag reading station employs a through technique. In certain of these embodiments, the radio frequency identification tag reader in connection with which the narrow angle radio frequency identification tag reading station is adapted for use has separate read and write ports, and the narrow angle radio frequency identification tag reading station further includes a power splitter or Tee, the power splitter or tee having three ports, one of which is in communication with the radio frequency identification tag reader, one of which is in communication with the first waveguide to coax adapter, with an isolator disposed therebetween, and one of which is attached to a resistive termination. In certain embodiments, the radio frequency identification tag reader in connection with which the narrow angle radio frequency identification tag reading station is adapted for use has a combined read and write port, and the narrow angle radio frequency identification tag reading station further includes a circulator, the circulator having three ports, one of which is in communication with the radio frequency identification tag reader, one of which is in communication with the first waveguide to coax adapter, and one of which in communication with the second waveguide to coax adapter, with an isolator disposed therebetween.

In some embodiments, the window assembly comprises two outer plates with an inner plate sandwiched therebetween, the inner plate defining a channel adapted to receive the web of carrier material, and the two outer plates defining a window aligned with the channel.

The invention and its particular features and advantages will become more apparent from the following detailed description considered with reference to the accompanying drawings.

DETAILED DESCRIPTION OF EXEMPLARY EMBODIMENTS OF THE INVENTION

As discussed in more detail above, existing systems for reading RFID tags are optimized to read many tags at the same time. These RFID tags have typical rates of failure to read of about 20%. Existing systems do not permit the verification of a single tag, activating the single RFID tag and no others. As an example, the ultra high frequency 900 MHz tags use a spread of frequencies from about 902 MHz through about 928 MHz. The RFID reader produces a transmitted pulse of sufficient power to energize and activate any illuminated RFID tags. The RFID reader then goes into a receive state to receive any transmissions from the activated RFID tags.

However, a problem exists in that adjacent tags on the strip can be energized and activated, making it difficult to know exactly which particular tag of a group of tags is responding. The present invention allows the speedy and automated verification of individual tags when it is not known beforehand that the tag is operational. The known good tags can then be incorporated into more complex products with less scrap/wastage.

Figure 1:
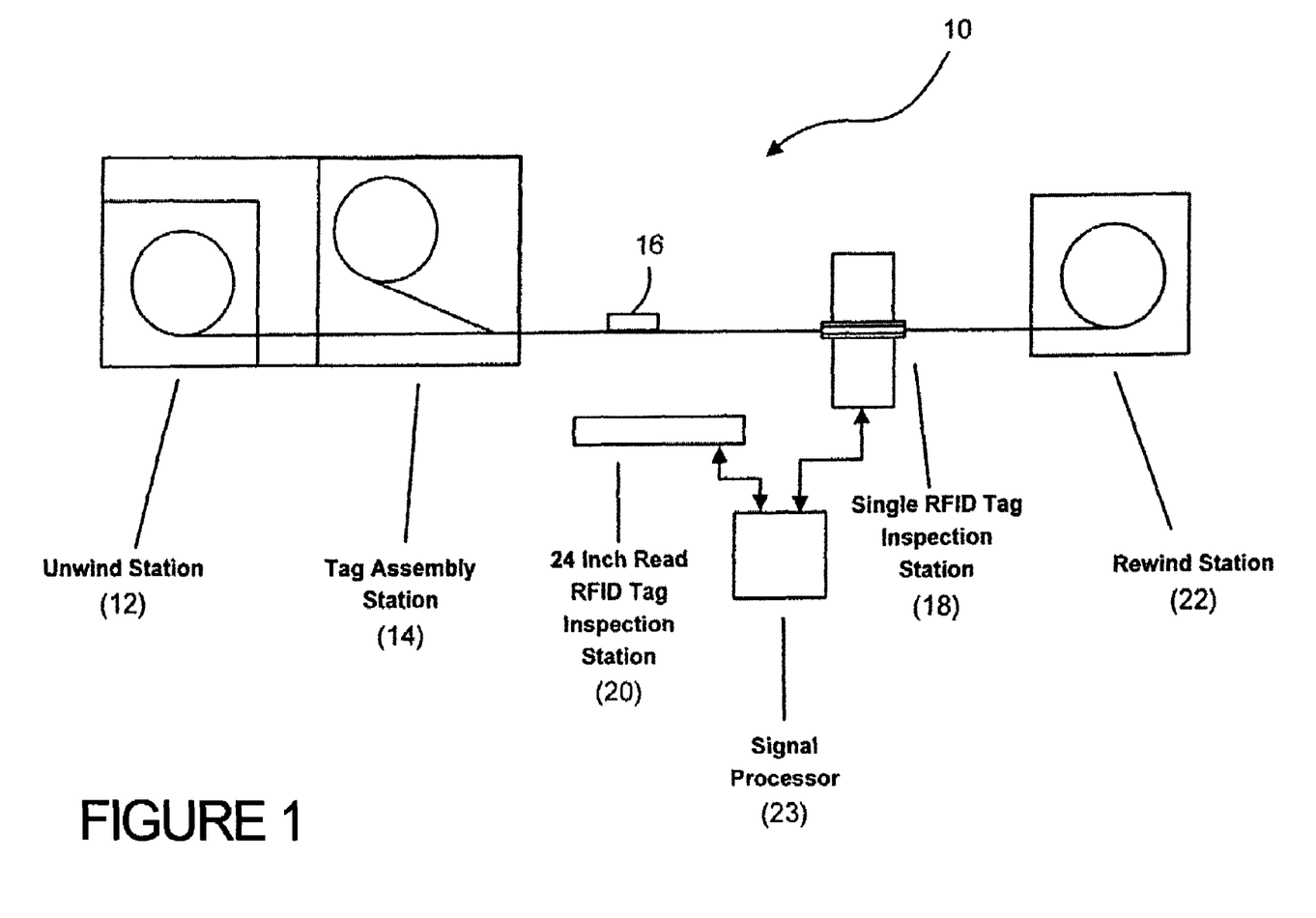
FIG. 1 schematically illustrates a complete system for validating RFID tags in accordance with an embodiment of the present invention, in which a method for discriminating individual RFID tags in accordance with an embodiment of the present invention is embodied.

A complete system 10 for validating RFID tags in accordance with an embodiment of the present invention is shown in FIG. 1. System 10 includes an unwind station 12 where untested RFID tags are loaded, and a tag assembly station 14 where the RFID tags are mated with printed labels. The RFID tag/label combinations are carried through system 10 on a web 16 of carrier material or the like past a narrow angle RFID tag inspection station 18 at which single RFID tags are verified as functional, and past a long range (e.g., 24 inch) tag inspection station 20 at which the tags are verified as readable at a longer distance. After inspection, the 100% verified, assembled tags/labels are wound at a rewind station 22 for packaging and ultimate shipping to a customer. Because unwind stations, tag assembly stations and rewind stations are very well known in the art, and the operation thereof will be known to those skilled in the art, a detailed description of the configuration and operation thereof is not presented herein.

Referring now to FIGS. 2 through 7B, the configuration and operation of an exemplary embodiments of narrow angle RFID tag inspection station 18 is described in more detail. As discussed above, system 10 includes a single tag reader station 18 side by side with a multi tag reader station 20 to sort out bad tags with the first, while verifying distant multi tag reading with the latter, with one high speed process run. This mandates isolation or shielding of the single tag reader 18 from the electromagnetic field of the multi tag reader 20. The single tag reader may also be used to write tags as well. Known approaches attempt to use an antenna and a metal encasing as a shield. However, such configurations do not work reliably, because the metal encasing forms a waveguide with its limits due to lower and upper cut-off frequencies. The attenuation of the electromagnetic wave is high when the encasing forms a structure below the cut-off frequency of the fundamental $TE_{10}$ mode, and multiple modes occur when the encasing dimensions support higher order modes. The latter situation gives undesirable signal nulls due to multiple reflections and phasing. A controlled waveguide approach was therefore chosen for this single tag reader design.

In the exemplary embodiments discussed herein, the tags are designed for the 900 to 1000 MHz operational frequency band. As such, the rectangular waveguide size WR 975 was chosen. Its lower $TE_{10}$ cut-off frequency is at 605 MHz and the next higher order mode $TE_{01}$ has a cut-off frequency of 1,208 MHz. The operational frequency band of this waveguide is from 750 to 1120 MHz.

RFID tag inspection station 18 employs two waveguide to coax adaptors 30, 32 back to back to generate a clean electromagnetic field and to detect the amplitude keying modulated (AKM) signal of a single tag. The waveguide shields, in addition, against any outside electromagnetic field. A metal window assembly 34, 34' (discussed in more detail below) is positioned between the two adaptors 30, 32 in order to minimize reflections within the waveguide assembly and to shield tags on the tape adjacent to the tag under test from being activated.

Figure 2:
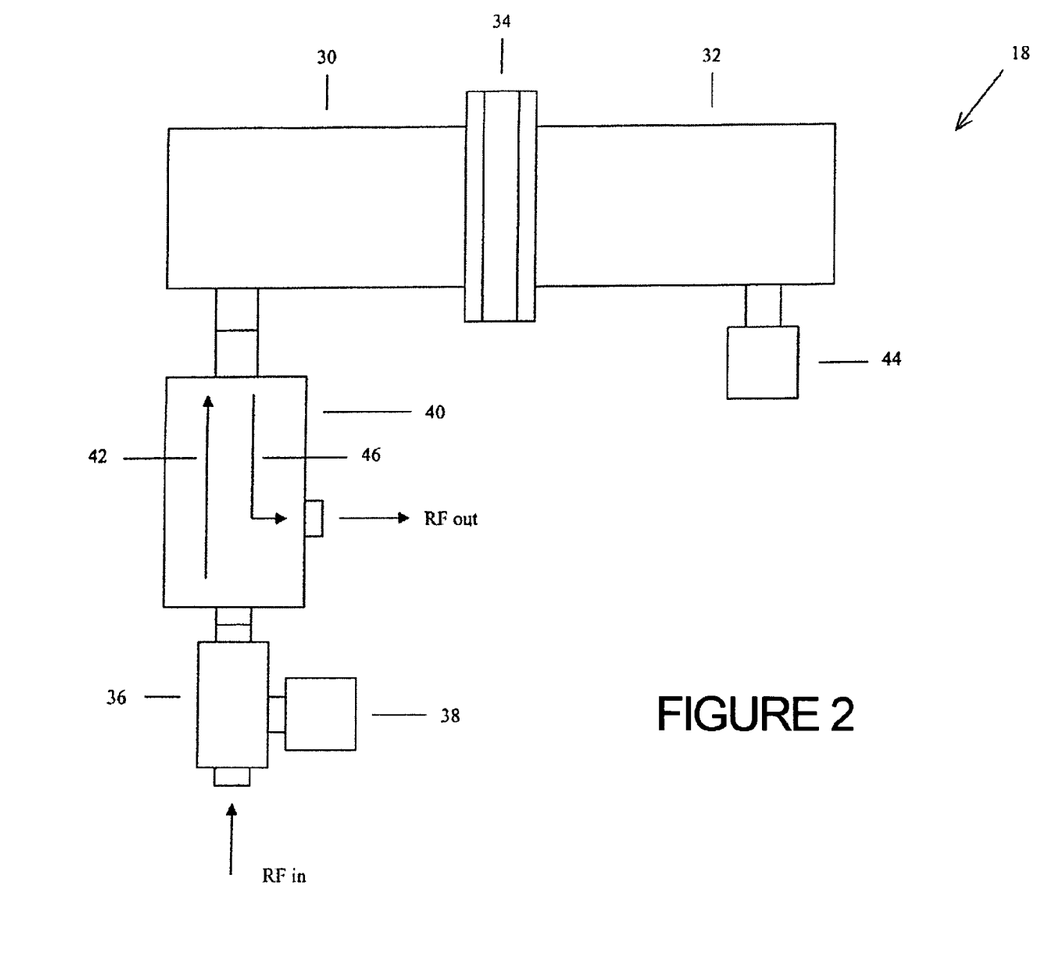
FIG. 2 schematically illustrates in more detail an embodiment of the single RFID inspection station portion of the system shown in FIG. 1.

Referring now in particular to FIG. 2, a particular exemplary embodiment of RFID tag inspection station 18 is shown schematically. Station 18 shown in this Figure is particularly adapted for use in connection with a reader having separate transmit and receive ports, and employs a reflective method of tag reading. In this embodiment, the signal from the reader/transmitter is fed through a power splitter or Tee 36, with a resistive termination 38 at its side arm, and through a directional coupler 40 (indicated by arrow 42) into the first coax to waveguide adapter 30. It should be noted that the power splitter or Tee 36, with the resistive termination 38, is only necessary when the reader being employed wants to see a current return of a connected antenna before turning the output on in order to protect the output amplifier. Such a reader has been distributed by Matrics, Inc. (recently acquired by Symbol Technologies).

The incident wave initiates the circuit on a tag in the widow assembly 34, which then emits an AKM signal. The AKM coding is done by either an open/short or a capacitor load (charged or not) of the tag antenna. An open is a binary 1 and a short a binary 0. The emitted signal is very weak and would, therefore, be undetectable if superposed to the strong incident signal. However, the window assembly not only shields the adjacent tags from the electromagnetic field, but is also tuned to the operational frequency band. Most of the incident wave energy travels through the second coax to waveguide adaptor 32 and is absorbed by an attached termination 44. A relatively small portion only is reflected by the window assembly 34 and travels back with the superposed tag signal through the directional coupler 40 (indicated by arrow 46). The signal is detected at its side arm. A not shown optical sensor synchronizes the tag position with the reader. It is an option to use a circulator instead of the directional coupler.

Figure 3:
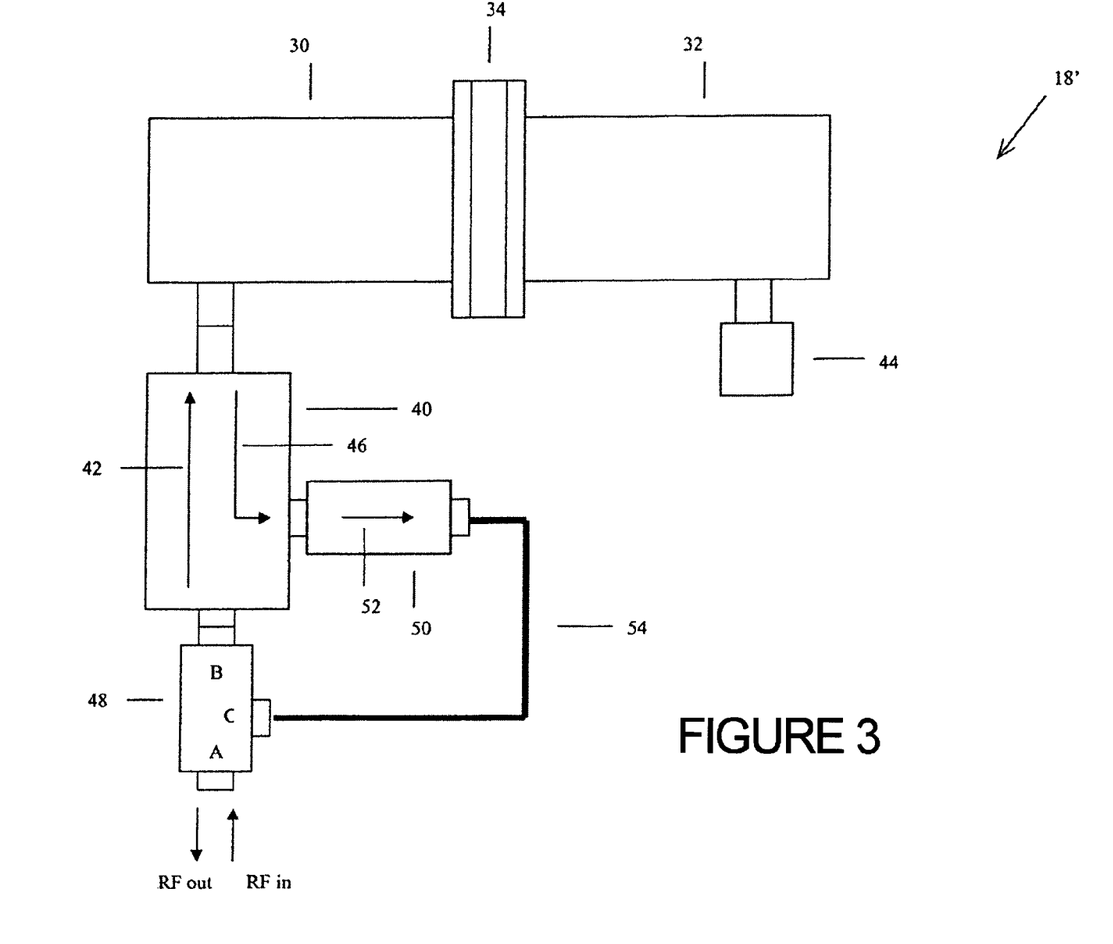
FIG. 3 schematically illustrates in more detail an embodiment of the single RFID inspection station portion of the system shown in FIG. 1.

Referring now in particular to FIG. 3, another particular exemplary embodiment of RFID tag inspection station 18' is shown schematically. Station 18' shown in this Figure is particularly adapted for use in connection with a reader having a combined transmit and receive port (such a reader having been distributed by Alien Technology Corporation), and also employs a reflective method of tag reading. Station 18' shown in FIG. 3 shares many commonalities with station 18 shown in FIG. 2, and like components are referenced using like designations.

In this embodiment, it is assumed that the reader does not need a current flow through an attached antenna to be activated, and as such, no power splitter or Tee, with attached resistive termination, is shown. The reader is connected to port A of a circulator 48. Its port B is connected to the through port of the directional coupler 40. The reflected signal travels through the side arm of the directional coupler 40 (as indicated by arrow 46), an isolator 50 (as indicated by arrow 52) and the port C of the circulator 48 back to port A and to the reader. The circulator 48 directs the signal flow; the isolator 50 prevents that part of the reflected signal from traveling back to the coax to waveguide adaptor 30 through the ports B and C of the circulator 48. A coaxial cable connection 54 is here used. The other components can be connected directly or with interface adaptors.

Figure 4:
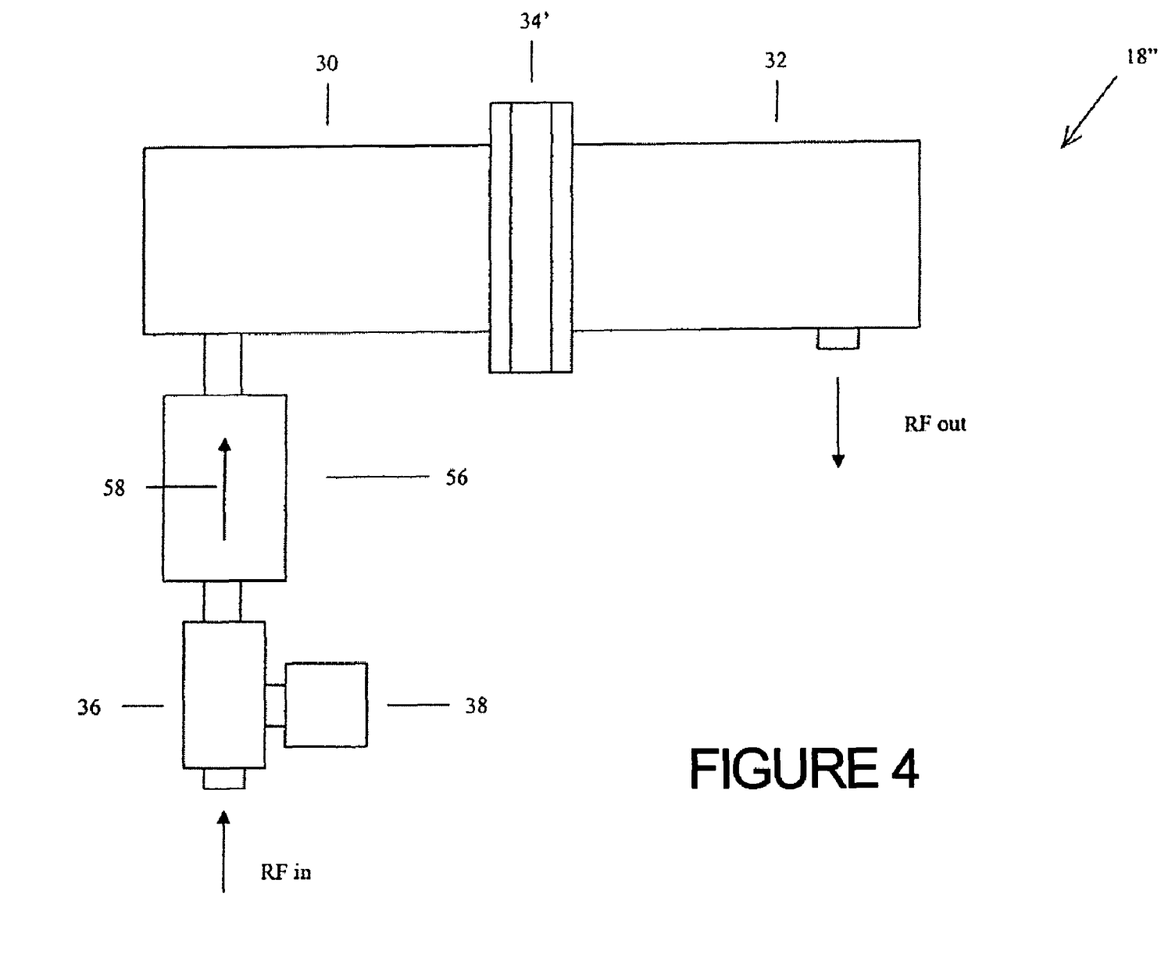
FIG. 4 schematically illustrates in more detail an embodiment of the single RFID inspection station portion of the system shown in FIG. 1.

Referring now in particular to FIG. 4, another particular exemplary embodiment of RFID tag inspection station 18" is shown schematically. Station 18" shown in this Figure is particularly adapted for use in connection with a reader having separate transmit and receive ports (such a reader having been distributed by Matrics, Inc.), and employs a through method of tag reading rather than a reflective method of tag reading. Station 18" shown in FIG. 4 shares many commonalities with station 18 shown in FIG. 2, and like components are referenced using like designations.

In this embodiment, it is assumed that the reader does need a current flow through an attached antenna to be activated, and as such, a power splitter or Tee 36, with attached resistive termination 38, is provided. The transmit signal of the reader is fed through the power splitter 36 with the attached resistive termination 38 and through an isolator 56 (indicated by arrow 58) into the coax to waveguide adaptor 30. The window assembly 34 is not tuned to the operational frequency band, but dimensioned to the tag antenna width and height or tag height. The reflection of the incident signal at the window assembly 34 is therefore very high, but the level of the through signal is low. It is superposed by the tag signal like the reflected signal is, because the radiation pattern of the tag dipole has a doughnut shape. This signal travels through the waveguide to coax adaptor 32 to the receive port of the reader, where it is detected.

Figure 5:
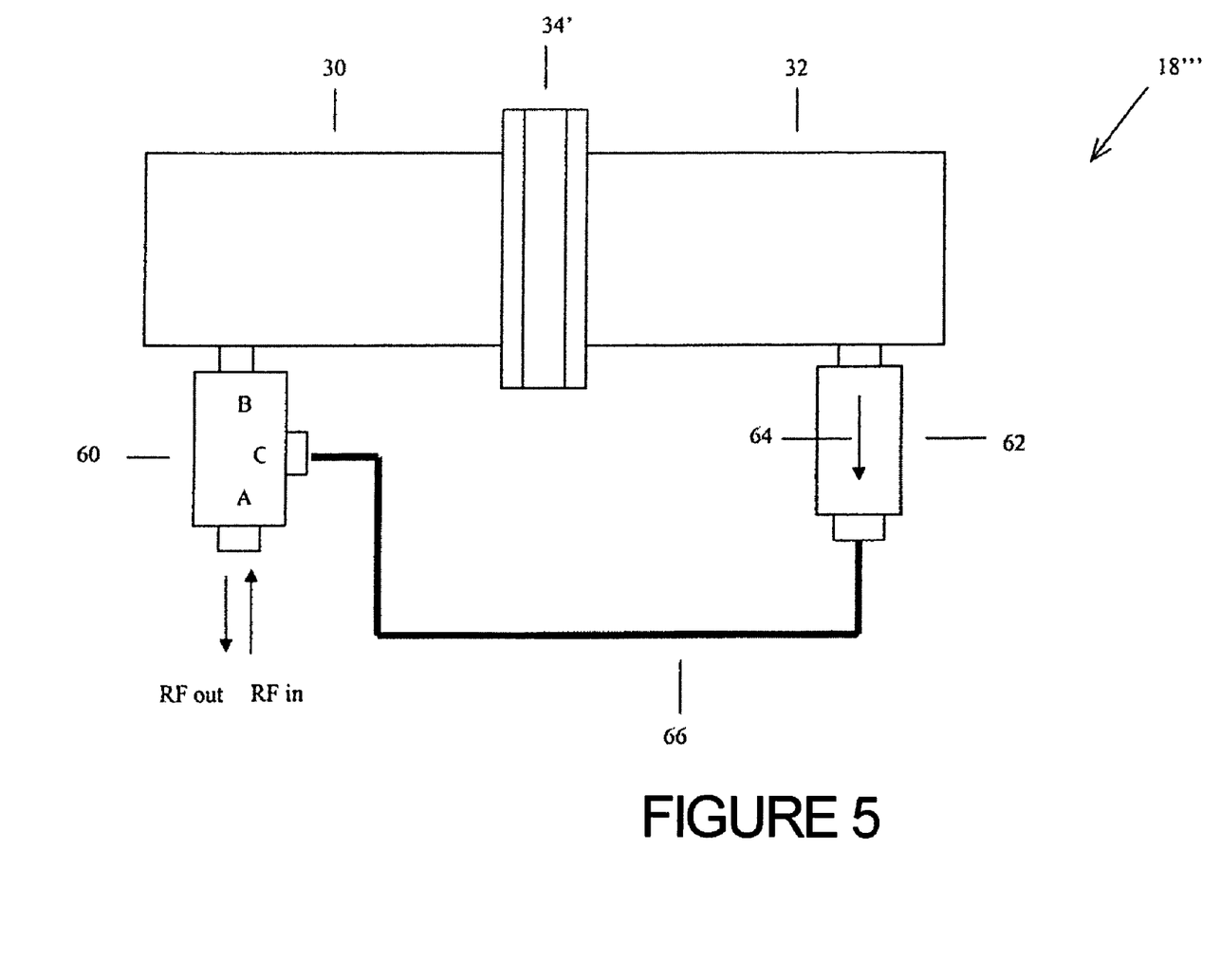
FIG. 5 schematically illustrates in more detail an embodiment of the single RFID inspection station portion of the system shown in FIG. 1.

Referring now in particular to FIG. 5, another particular exemplary embodiment of RFID tag inspection station 18''' is shown schematically. Station 18''' shown in this Figure is particularly adapted for use in connection with a reader having a combined transmit and receive port (such a reader having been distributed by Alien Technology Corporation), and also employs a through method of tag reading, rather than a reflective method. Station 18''' shown in FIG. 5 shares many commonalities with station 18 shown in FIG. 2, and like components are referenced using like designations.

In this embodiment, it is assumed that the reader does not need a current flow through an attached antenna to be activated, and as such, no power splitter or Tee, with attached resistive termination, is shown. The transmit/receive port of the reader is connected to port A of the circulator 60. The incident signal travels through port B into the coax to waveguide adaptor 30. The modulated signal leaves the waveguide assembly through an isolator 62 (indicated by arrow 64), which is attached to the port of the waveguide to coax adaptor 32, into port C of the circulator 60 and through port A to the reader. The isolator is necessary to avoid a flow of part of the reflected signal through the ports B and C back into the coax to waveguide adaptor 32. A coaxial cable connection 66 is used between the isolator 62 and port C of the circulator 60. The other components can be connected directly or with interface adaptors.

As will be recognized by those skilled in the art, the transmitted power level should be optimized for each case depending on the specific configuration of the components employed. Also as will be recognized by those skilled in the art, the configurations described above with reference to FIGS. 2 through 5 cannot only be used to sort out bad tags, but also to write tags. The only difference is the power level and the coding (modulation) of the signal. As will be further recognized by those skilled in the art, the tag antenna under test radiates signals in both directions, the forward and backward direction. The reflective method (as shown in FIGS. 2 and 3) uses the backward portion, because the high level of the incident RF covers the forward emitted tag signal, whereas the level of the reflected incident signal is low, and the backward portion of the emitted signal is detectable. The through method (as shown in FIGS. 4 and 5) has a high level of the reflected incident RF and a low level of its energy transmitted through the window.

As discussed above, a metal window assembly 34, 34' is positioned between the two waveguide to coax adaptors 30, 32 in order to minimize reflections within the waveguide assembly and to shield tags on the tape adjacent to the tag under test from being activated. Turning now to FIGS. 6A through 7B, the configuration of exemplary embodiments of window assembly 34, 34' are described in more detail.

The window assembly 34, 34' includes three plates, the web of carrier material 16, with the tags carried thereon, being fed through a channel 68 through the center plate 70. The two outer plates 72 define the electrical window 74 and are preferably identical. Plates 70, 72 include a plurality of holes 76 passing therethrough through which fasteners are passed to hold plates 70, 72 together as well as to fasten window assembly 34, 34' in place between waveguide to coax adaptors 30, 32. Holes 76 may be arranged in a pattern in accordance with published standards, or may be arranged in a custom pattern.

Figure 6A:
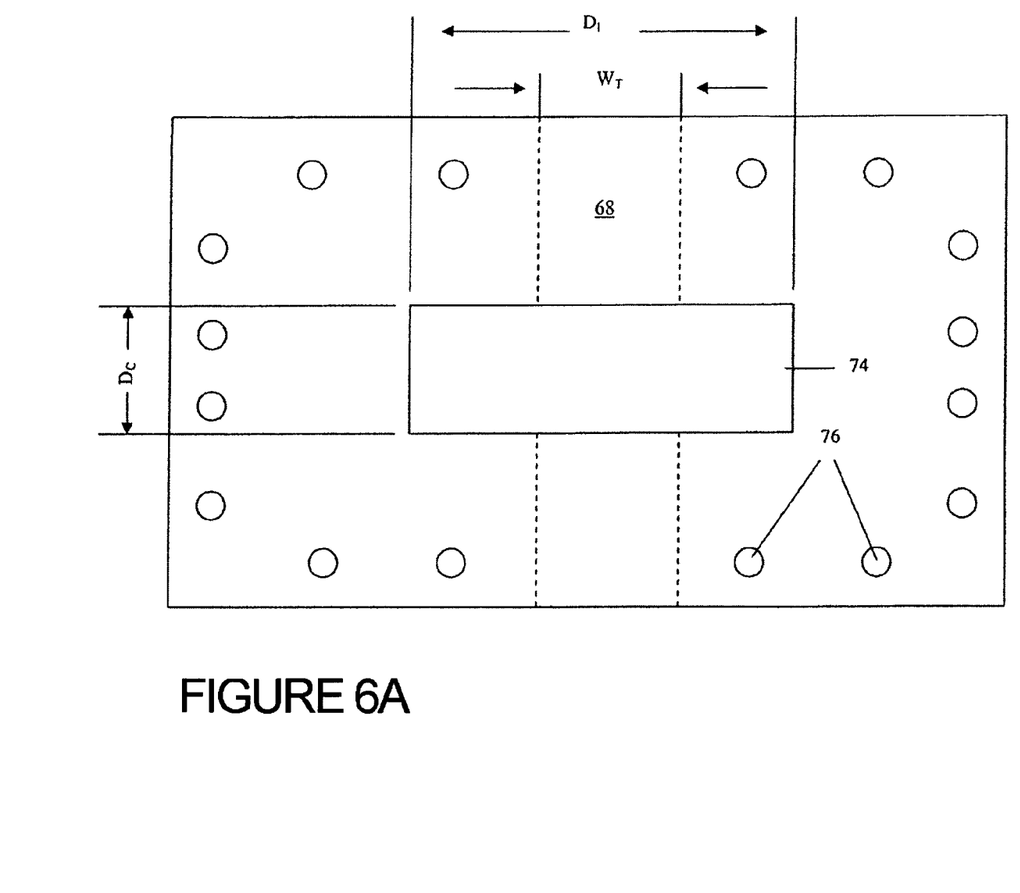
FIGS. 6A and 6B schematically illustrate in more detail an embodiment of a window assembly particularly suited for use with the single RFID inspection station shown in FIGS. 2 and 3.
Figure 6B:
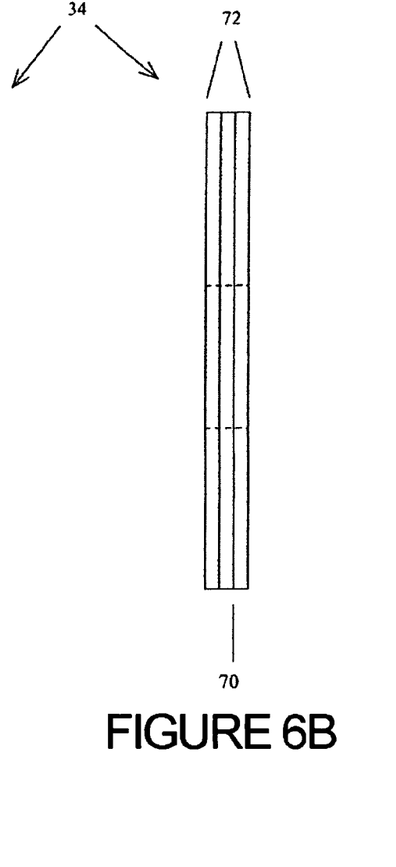
Figure 7A:
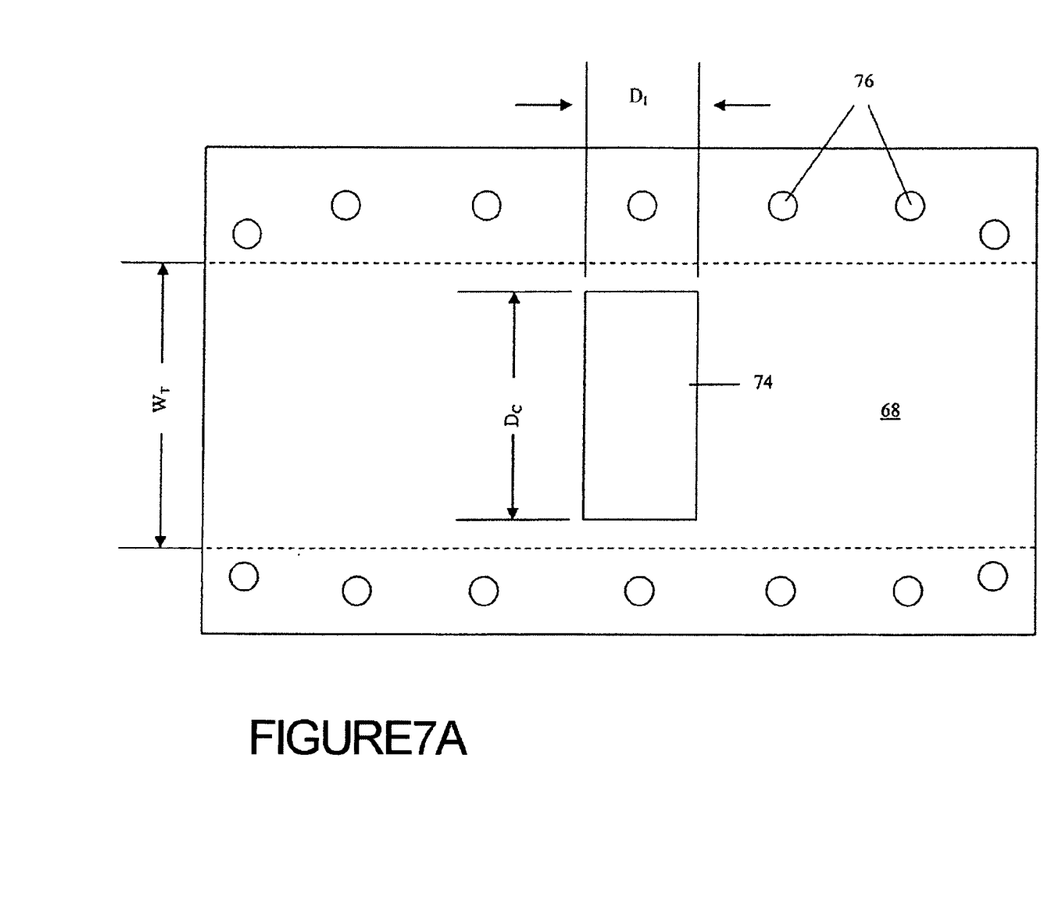
FIGS. 7A and 7B schematically illustrate in more detail an embodiment of a window assembly particularly suited for use with the single RFID inspection station shown in FIGS. 4 and 5.
Figure 7B:
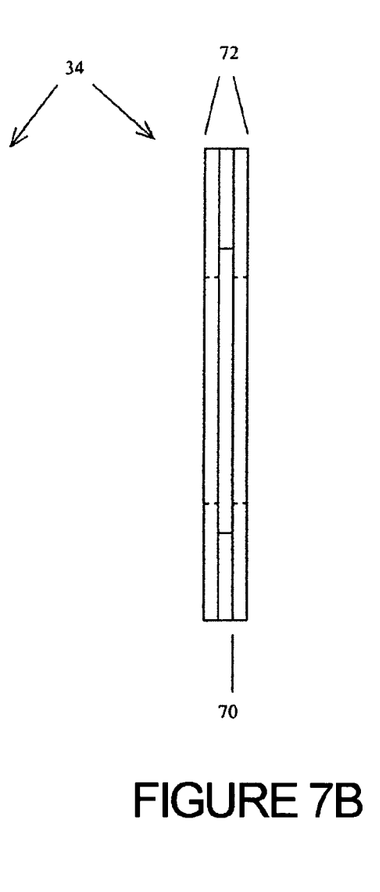

The dipole antenna on the tags must be parallel to the electric field within the waveguide, but they may be arranged either perpendicular or parallel to the length of the web of carrier material 16. This necessitates two different versions 34 and 34' for the window assembly. Referring specifically to FIGS. 6A and 6B, a window assembly 34 particularly suited for use with a single RFID inspection station employing a reflective method (as shown in FIGS. 2 and 3) is schematically illustrated. In this case, the tag antennas are parallel to the tape length. Referring specifically to FIGS. 7A and 7B, a window assembly 34' particularly suited for use with a single RFID inspection station employing a through method (as shown in FIGS. 4 and 5) is schematically illustrated. In this case, the tag antennas are perpendicular to the length of the web of carrier material 16.

The tape can be fed through the broad side (top to bottom or bottom to top) of the waveguide when the tag antennas are parallel to the tape length (as shown in FIGS. 6A and 6B) or through the narrow side (left to right or right to left) of the waveguide when the tag antennas are perpendicular to the length of the web of carrier material 16 (as shown in FIGS. 7A and 7B).

With reference to the configuration of window assembly 34 shown in FIGS. 6A and 6B, the window dimensions $D_C$ and $D_I$ can be tuned for minimal reflection. Equations and diagrams to calculate these dimensions for a given resonant frequency will be known to those skilled in the art, and can be found, for example, in the following reference: N. Marcuvitz, *Waveguide Handbook*, McGraw-Hill, New York (1951), Chapter 5. The dimension $D_C$ is given by the length of the tag antenna, the dimension $D_I$ can be calculated from there. $D_C$ determines the capacity and $D_I$ the inductance of the window. The calculation is, however, only accurate for very thin windows, compared to the wavelength in the waveguide. Therefore, $D_I$ must be fine tuned with the help of a network analyzer. The width $W_T$ of the channel 68 is defined by the width of the web of carrier material 16 to be fed through the window.

Resonance dimensions can be calculated as well for window assembly 34' (shown in FIGS. 7A and 7B) where the tag antenna is perpendicular to the length of the web of carrier material 16. However, such is not desirable because several tags would be in the window due to the web being fed through the small side of the waveguide, and the resulting $D_I$ being relatively large. Although a software routine could be used to sort out bad tags passing through the window nevertheless, Applicants have found that a through measurement technique (discussed above in connection with FIGS. 4 and 5), is more desirable instead. Thus, with respect to window assembly 34', $D_I$ is chosen so that only one tag antenna is in the window 74 at any time. $D_C$ can be as small as the antenna length or as large as the entire tag width $W_T$, since this dimension is not critical for this method.

It should be recognized by those skilled in the art from the above discussion that each tag size dictates its own specific window assembly configuration.

As discussed briefly above, the system 10 of the present invention can be usefully augmented by an additional RFID reader antenna 20. This antenna 20 is placed at a typical RFID read distance; in the currently described exemplary embodiment, this is 24 inches. This additional channel of information is coupled with the individual RFID tag data determined by the narrow angle RFID tag inspection station 18, 18', 18", 18'''; it provides a verification that a given RFID tag has sufficient power response to use in a typical end-user environment. As discussed in more detail above, RFID shielding is preferably employed to limit the number of RFID tag responses, so the inspection equipment does not have to traverse a large list of perceived, responding RFID tags. A sizable list would make it harder to achieve the throughput of 100% inspected RFID tags. It should be noted that although FIG. 1 shows additional RFID reader antenna 20 being disposed upstream of the narrow angle RFID tag inspection station 18, 18', 18", 18''', the order thereof may be reversed.

Operation of system 10 is now discussed in more detail. As discussed above, in certain preferred embodiments, system 10 employs two readers to read and determine if tags are readable. In certain preferred embodiments, the tags are first read by wide angle reader 20 and then by narrow angle reader 18, 18', 18", 18'''. A data processor computer stores the electronic product code (EPC) serial numbers from the last 30 tags read by the wide angle reader 20. It should be noted that the quantity of 30 tags is determined by the size of the total number of tags that are readable by the wide angle reader 20, and the total number of tags that are not visible to the wide angle reader 20 and the narrow angle reader 18, 18', 18", 18'''. When a valid tag is read by the narrow angle reader 18, 18', 18", 18''', the data processor computer checks to determine if the tag's EPC serial number was also read by the wide angle reader 20 by searching EPC serial numbers stored by the wide angle reader 20. If so, the tag is considered to be good.

As the tags are read, either by the wide angle reader 20 or by the narrow angle reader 18, 18', 18", 18''', raw tag data is sent out to the data processor computer for data logging purposes. The tag data is then "parsed" out into its constituent data. This data may consist of, for example, the following: EPC header (8 bits); EPC Object Type data (3 bits); EPC Partition data (3 bits); EPC Manager data (24 bits); EPC Object Class data (20 bits); and EPC Serial Number data (38 bits).

The wide angle reader 20 is preferably configured so as to limit the number of tags able to be read at any one time. The maximum number of tags read by the wide angle reader 20 is 6 tags in certain preferred embodiments.

In operation, the wide angle reader 20 is commanded to read by the data processor computer. The data processor computer then waits for a response from the wide angle reader 20, and the data processor computer inputs the tag data for one tag and parses out the data. The data processor computer then checks the EPC Manager number from the tag against the required EPC Manager number. If the EPC Manager numbers do not match, the data processor computer declares an error and stops the system 10. The data processor computer then checks the EPC Object Class data from the tag against the required EPC Object Class. If the EPC Object Classes do not match, the data processor computer declares an error and stops the system 10.

The data processor computer then checks to see if the EPC Serial Number is found within the EPC Serial Numbers stored by the wide area reader 20. If the EPC Serial Number is found in the stored data, the data processor computer then checks the next tag's data. If the EPC Serial Number is not found within the stored data, the data processor computer replaces the oldest EPC Serial Number with the current EPC Serial Number. In this manner, the data processor computer produces a database of the last 30 tags read.

The data processor computer also commands the narrow angle tag reader 18, 18', 18", 18''' to read a tag whenever a tag is within the read window of the narrow angle tag reader 18, 18', 18", 18'''. The data processor computer then waits for a response from the narrow angle tag reader 18, 18', 18", 18'''. If the narrow angle tag reader 18, 18', 18", 18''' returns valid tag data, the data processor computer parses out the tag data, checks the EPC Manager number and EPC Object Class against the required EPC Manager number and EPC Object Class to make sure that the tag is valid. If the tag is not valid, the data processor computer declares an error and stops the system 10.

If the EPC Manager number and the EPC Object Class are valid, the data processor computer then compares the EPC Serial Number with the EPC Serial Numbers stored in the database by the wide angle reader 20. If the EPC Serial Number is found in the database, it means that the tag was readable by both the wide angle reader 20 and the narrow angle reader 18, 18', 18", 18''', and the tag is therefore declared good. If the EPC Serial Number is not found in the database, it means that the tag was readable by the narrow angle tag reader 18, 18', 18", 18''', but not by the wide angle reader 20, and the tag is therefore declared bad. If the narrow angle tag reader 18, 18', 18", 18''' returns no valid tag data, it means that the tag was not readable by the narrow angle tag reader 18, 18', 18", 18''', and the tag if therefore declared bad.

The present invention, therefore, provides a system and method for validating radio frequency identification tags to ensure proper functioning thereof which is capable of ensuring that 100% (or at least very close to 100%) of the RFID labels are readable, which is capable of reading and verifying RFID labels when they are in their finished state, i.e. mounted in close proximity to one and another (e.g., inches apart) on a liner or carrier (for example a continuous web of paper of the like), which is adapted to be used in conjunction with tags having a long read range (e.g., greater than 24"), and which is capable of reading and validating labels moving at a relatively fast speed.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A radio frequency identification tag reading/writing station adapted to be used with a radio frequency identification tag reader/writer in order to read/write radio frequency identification tags on a continuous web of carrier material, said radio frequency identification tag reading/writing station comprising:
   a first waveguide to coax adaptor;
   a second waveguide to coax adapter;
   a window assembly having a window therein, said window being sized and shaped such that a tag on the web of carrier material under test is exposed to radio frequency read/write energy, but such that tags on the web of carrier material adjacent to the tag under test are shielded from the radio frequency read/write energy; and
   wherein said first waveguide to coax adapter and said second waveguide to coax adapter are disposed end-to-end with said window assembly being disposed therebetween.

2. The radio frequency identification tag reading/writing station of claim 1 wherein the radio frequency read/write energy is introduced through said first waveguide to coax adapter, and wherein signals emitted by the tag under test are reflected back through said first waveguide to coax adapter, whereby the radio frequency identification tag reading/writing station employs a reflective technique.

3. The radio frequency identification tag reading/writing station of claim 2 further comprising a resistive termination in communication with said second waveguide to coax adapter for absorbing radio frequency read/write energy passing through said window assembly into said second waveguide to coax adapter.

4. The radio frequency identification tag reading/writing station of claim 2 further comprising:
   a directional coupler, said directional coupler comprising a first port, a second port and a third port;
   wherein the radio frequency read/write energy passes through said directional coupler from the first port to the second port of said directional coupler; and
   wherein the signals emitted by the tag under test pass through said directional coupler from the second port to the third port of said directional coupler, where the reflected signals emitted by the tag under test are adapted to be read.

5. The radio frequency identification tag reading/writing station of claim 4 wherein the radio frequency identification tag reader/writer in connection with which the radio frequency identification tag reading/writing station is adapted for use has separate read and write ports, and further comprising a power splitter or Tee, the power splitter or tee having three ports, one of which is in communication with the radio frequency identification tag reader/writer, one of which is in communication with said directional coupler, and one of which is in communication with a resistive termination.

6. The radio frequency identification tag reading/writing station of claim 4 wherein the radio frequency identification tag reader/writer in connection with which the radio frequency identification tag reading/writing station is adapted for use has a combined read and write port, and further comprising a circulator, the circulator having three ports, one of which is in communication with the radio frequency identification tag reader/writer, one of which is in communication with the first port of said directional coupler, and one of which in communication with the third port of said directional coupler, with an isolator disposed therebetween.

7. The radio frequency identification tag reading/writing station of claim 1 wherein the radio frequency read/write energy is introduced through said first waveguide to coax adapter, and wherein signals emitted by the tag under test are passed through said window assembly and said second waveguide to coax adapter, whereby the radio frequency identification tag reading/writing station employs a through technique such that the signals emitted by the tag under test and passed through said window assembly and said second waveguide to coax adapter are adapted to be read.

8. The radio frequency identification tag reading/writing station of claim 7 wherein the radio frequency identification tag reader/writer in connection with which the radio frequency identification tag reading/writing station is adapted for use has separate read and write ports, and further comprising a power splitter or Tee, the power splitter or tee having three ports, one of which is in communication with the radio frequency identification tag reader/writer, one of which is in communication with said first waveguide to coax adapter, with an isolator disposed therebetween, and one of which is attached to a resistive termination.

9. The radio frequency identification tag reading/writing station of claim 7 wherein the radio frequency identification tag reader/writer in connection with which the radio frequency identification tag reading/writing station is adapted for use has a combined read and write port, and further comprising a circulator, the circulator having three ports, one of which is in communication with the radio frequency identification tag reader/writer, one of which is in communication with said first waveguide to coax adapter, and one of which in communication with said second waveguide to coax adapter, with an isolator disposed therebetween.

10. The radio frequency identification tag reading/writing station of claim 1 wherein said window assembly comprises two outer plates with an inner plate sandwiched therebetween, the inner plate defining a channel adapted to receive the web of carrier material, and the two outer plates defining a window aligned with the channel.

11. The radio frequency identification tag reading/writing station of claim 1 wherein the radio frequency identification tag reading/writing station is used to read tags.

12. The radio frequency identification tag reading/writing station of claim 1 wherein the radio frequency identification tag reading/writing station is used to write to tags.

13. A system for validating each of a plurality of radio frequency identification tags disposed on a continuous web of carrier material in close proximity to one another to ensure proper functioning thereof, said system comprising:
   a narrow angle radio frequency identification tag reading station which reads a designation of each radio frequency identification tag individually in order to generate a first list of tag designations read thereby, said narrow angle radio frequency identification tag reading station adapted to be used with a radio frequency identification tag reader in order to read the radio frequency identification tags on the continuous web of carrier material, said narrow angle radio frequency identification tag reading station comprising:
      a first waveguide to coax adaptor;
      a second waveguide to coax adapter;
      a window assembly having a window therein, said window being sized and shaped such that a tag on the web of carrier material under test is exposed to radio frequency read energy, but such that tags on the web of carrier material adjacent to the tag under test are shielded from the radio frequency read energy; and
      wherein said first waveguide to coax adapter and said second waveguide to coax adapter are disposed end-to-end with said window assembly being disposed therebetween;
   a wide angle radio frequency identification tag reading station which reads designations of a plurality of radio frequency identification tags on the continuous web of carrier material simultaneously from a long range in order to generate a second list of tag designations read thereby; and
   a processor which compares the first list of tag designations with the second list of tag designations and evaluates the functionality of the plurality of radio frequency identification tags based at least in part upon the comparison.

14. The system of claim 13 wherein the radio frequency read energy is introduced through said first waveguide to coax adapter, and wherein signals emitted by the tag under test are reflected back through said first waveguide to coax adapter, whereby the narrow angle radio frequency identification tag reading station employs a reflective technique.

15. The system of claim 14 further comprising a resistive termination in communication with said second waveguide to coax adapter for absorbing radio frequency read energy passing through said window assembly into said second waveguide to coax adapter.

16. The system of claim 14 wherein said narrow angle radio frequency identification tag reading station further comprises:
   a directional coupler, said directional coupler comprising a first port, a second port and a third port;
   wherein the radio frequency read energy passes through said directional coupler from the first port to the second port of said directional coupler; and
   wherein the signals emitted by the tag under test pass through said directional coupler from the second port to the third port of said directional coupler.

17. The system of claim 16 wherein the radio frequency identification tag reader in connection with which the narrow angle radio frequency identification tag reading station is adapted for use has separate read and write ports, and wherein the narrow angle radio frequency identification tag reading station further comprises a power splitter or Tee, the power splitter or tee having three ports, one of which is in communication with the radio frequency identification tag reader, one of which is in communication with said directional coupler, and one of which is in communication with a resistive termination.

18. The system of claim 16 wherein the radio frequency identification tag reader in connection with which the narrow angle radio frequency identification tag reading station is adapted for use has a combined read and write port, and wherein the narrow angle radio frequency identification tag reading station further comprises a circulator, the circulator having three ports, one of which is in communication with the radio frequency identification tag reader, one of which is in communication with the first port of said directional coupler, and one of which in communication with the third port of said directional coupler, with an isolator disposed therebetween.

19. The system of claim 13 wherein the radio frequency read energy is introduced through said first waveguide to coax adapter, and wherein signals emitted by the tag under test are passed through said window assembly and said second waveguide to coax adapter, whereby the narrow angle radio frequency identification tag reading station employs a through technique.

20. The system of claim 19 wherein the radio frequency identification tag reader in connection with which the narrow angle radio frequency identification tag reading station is adapted for use has separate read and write ports, and wherein the narrow angle radio frequency identification tag reading station further comprises a power splitter or Tee, the power splitter or tee having three ports, one of which is in communication with the radio frequency identification tag reader, one of which is in communication with said first waveguide to coax adapter, with an isolator disposed therebetween, and one of which is attached to a resistive termination.

21. The system of claim 19 wherein the radio frequency identification tag reader in connection with which the narrow angle radio frequency identification tag reading station is adapted for use has a combined read and write port, and wherein the narrow angle radio frequency identification tag reading station further comprises a circulator, the circulator having three ports, one of which is in communication with the radio frequency identification tag reader, one of which is in communication with said first waveguide to coax adapter, and one of which in communication with said second waveguide to coax adapter, with an isolator disposed therebetween.

22. The system of claim 13 wherein said window assembly comprises two outer plates with an inner plate sandwiched therebetween, the inner plate defining a channel adapted to receive the web of carrier material, and the two outer plates defining a window aligned with the channel.

* * * * *